(12) United States Patent
deVilliers et al.

(10) Patent No.: US 9,595,441 B2
(45) Date of Patent: Mar. 14, 2017

(54) PATTERNING A SUBSTRATE USING GRAFTING POLYMER MATERIAL

(71) Applicant: Tokyo Electron Limited, Minato-ku, Tokyo (JP)

(72) Inventors: Anton J. deVilliers, Clifton Park, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/973,346

(22) Filed: Dec. 17, 2015

(65) Prior Publication Data

US 2016/0181100 A1    Jun. 23, 2016

Related U.S. Application Data

(60) Provisional application No. 62/095,365, filed on Dec. 22, 2014.

(51) Int. Cl.
*H01L 21/033* (2006.01)

(52) U.S. Cl.
CPC ................................ *H01L 21/0337* (2013.01)

(58) Field of Classification Search
CPC .................. H01L 21/31144; H01L 21/0337
USPC ......................................... 438/694, 695, 696
See application file for complete search history.

(56) References Cited

U.S. PATENT DOCUMENTS

| | | | |
|---|---|---|---|
| 2005/0136630 A1* | 6/2005 | Kim | .................. H01L 21/32139 438/586 |
| 2010/0167548 A1* | 7/2010 | Kim | .................... H01L 21/0338 438/694 |
| 2010/0243161 A1 | 9/2010 | Tran | |
| 2012/0043646 A1 | 2/2012 | Kim | |
| 2012/0282751 A1* | 11/2012 | Oh | ...................... H01L 21/0337 438/382 |
| 2013/0309871 A1 | 11/2013 | De Villiers | |

(Continued)

FOREIGN PATENT DOCUMENTS

JP    2010-527138    8/2010

OTHER PUBLICATIONS

International Patent Application No. PCT/US2015/066462, "International Search Report and Written Opinion," mailed Apr. 25, 2016, International filing date Dec. 17, 2015.

*Primary Examiner* — Dung Le

(57) ABSTRACT

Patterning methods for creating sub-resolution trenches, contact openings, lines, and other structures at smaller dimensions as compared to using conventional self-aligned multiple patterning and sequential litho-etch deposition patterning approaches. Techniques herein include patterning using a grafting polymer material that has been modified to provide little or no etch resistance (fast etching). The grafting polymer material is deposited as spacer material on a substrate having mandrels. The spacer material selectively adheres to mandrel surfaces without adhering to exposed portions of an underlying layer. The spacer material also adheres up to a specific length so that sidewall spacers are formed. Openings between spacers are filled with a filler material, and then the sidewall spacers, made of the grafting material, are etched thereby creating antispacers. Etch transfer to a memorization layer and/or using additional relief patterns can be incorporated for creating various features.

18 Claims, 5 Drawing Sheets

(56) References Cited

U.S. PATENT DOCUMENTS

| | | | |
|---|---|---|---|
| 2014/0138800 A1* | 5/2014 | He | H01L 21/0337 257/632 |
| 2016/0011516 A1* | 1/2016 | deVilliers | G03F 7/039 430/323 |
| 2016/0111286 A1* | 4/2016 | Wen | H01L 21/0335 438/492 |
| 2016/0133477 A1* | 5/2016 | Trefonas, III | H01L 21/3086 257/618 |

* cited by examiner

PATTERNING A SUBSTRATE USING GRAFTING POLYMER MATERIAL

CROSS REFERENCE TO RELATED APPLICATIONS

The present application claims the benefit of U.S. Provisional Patent Application No. 62/095,365, filed on Dec. 22, 2014, entitled "Patterning a Substrate Using Grafting Polymer Material," which is incorporated herein by reference in its entirety.

BACKGROUND OF THE INVENTION

This invention relates to microfabrication including microfabrication of integrated circuits as well as processes involved in patterning semiconductor substrates.

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure creates a latent pattern within the radiation-sensitive material which can then be developed. Developing refers to dissolving and removing a portion of the radiation-sensitive material to yield a topographic or relief pattern. For example, developing can include removal of irradiated regions of the radiation-sensitive material (as in the case of positive photoresist), or non-irradiated regions (as in the case of negative resist) using a developing solvent. The relief pattern can then function as a mask layer.

SUMMARY

Conventional lithographic techniques for exposing a pattern of radiation or light onto a substrate have various challenges that limit a size of features exposed, and limit pitch or spacing between exposed features. Because of the limited resolution that is feasible using photolithographic exposure, various approaches have been introduced to pattern films beyond the resolution of what exposure tools can reliably provide. These techniques are known as double patterning, pitch multiplication (pitch density multiplication to be accurate), or sub-resolution patterning. These approaches can allow patterning of smaller features at a smaller pitch than what is currently possible with conventional lithographic techniques.

Patterning relatively small trench, contact hole, and slot contact structures for advancing integrated circuit (IC) fabrication nodes is becoming reliant of the incorporation of self-aligned multiple patterning (SAMP) schemes, through incorporation of multiple individual patterning processes that include lithography, etch, and deposition unit processing steps, and/or through the incorporation of EUV (extreme ultraviolet) lithography.

For an example case of fabricating relatively small trenches, the SAMP application can have a number of unit processing steps including: lithographic patterning of resist line structures, optional transfer of an image to an underlying hard-mask, deposition of a spacer material over the mandrel, performing a selective spacer-open etch which leaves a spacer running along the sidewall of the mandrel, and filling spacer-covered mandrels with a material selected to have designed etch selectivity (or etch resistivity) to the spacer, etching back or planarizing the covering material to uncover the spacer material, and then performing a selective etch which removes spacer material but leaves mandrels and filling materials on the substrate, thereby leaving a pattern of trenches defined by the deposition of the spacer material.

Techniques disclosed herein include patterning methods for creating sub-resolution trenches, contact openings, lines, and other structures with significant improvements over conventional self-aligned multiple patterning (SAMP) and sequential litho-etch deposition (LELE . . . ) multiple patterning approaches. Techniques herein include patterning using a grafting polymer material selected to have a composition with little or no etch resistance compared to other materials. This material can be used to create a deposited spacer with fast and selective etching, and can be incorporated in an anti-spacer flow. Spacer material is deposited conventionally, or by using a spin-on coating process of a composition that selectively adheres to mandrels without adhering to an underlying layer or floor material. A thickness of spacer material adhered to mandrels can be controlled by polymer length, thereby controlling CDs. An overcoat material can then be spun-on or otherwise deposited. After removing the spacer material, the substrate defines a pattern for continued processing or transfer into an underlying target layer.

One embodiment includes a method of forming a pattern on a substrate. This method comprises providing a substrate having mandrels positioned on a target layer. The mandrels comprise a first material and the target layer comprises a second material. The second material is selected to be chemically different than the first material. A spacer material is deposited on the substrate. The spacer material selectively adheres to exposed surfaces of the mandrels without adhering to exposed surfaces of the target layer. The result is creating spacers of a substantially uniform thickness formed at least on sidewalls of the mandrels. A filler material is then deposited on the substrate. The filler material fills spaces defined by spacer material on sidewalls of the mandrels. The filler material contacts the target layer through the defined spaces. The filler material forms a vertical interface with the spacers on sidewalls of the spacers. The filler material comprises a third material. The spacers are then removed resulting in the filler material and mandrels together defining a combined pattern. This combined pattern can then function as a mask for pattern transfer, or be used for continued patterning processes and structure formation.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
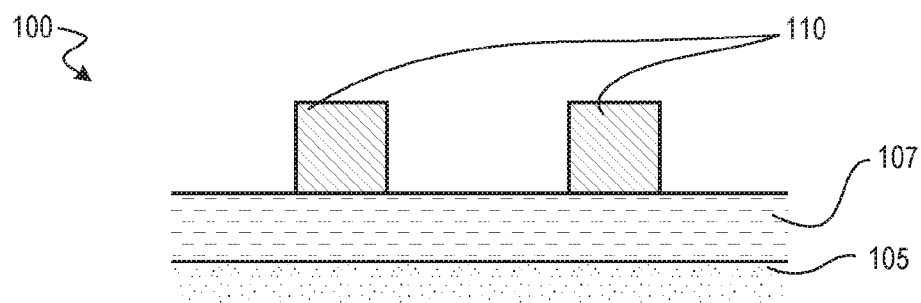
FIGS. 1-7 are schematic, cross-sectional views of a substrate segment showing a process sequence for patterning a substrate according to embodiments herein.

Techniques disclosed herein include patterning methods for creating sub-resolution trenches, contact openings, lines, and other structures with significant improvements over conventional self-aligned multiple patterning (SAMP) and sequential litho-etch deposition (LE repeated) multiple patterning approaches. Techniques herein include patterning using a grafting polymer material that has been modified to provide little or no etch resistance. Such material can be described as a fast-etching grafting polymer. This material can be used to create one or more new processes including selective etching deposited anti-spacer. Such an anti-spacer application provides a patterning process in which sub-resolution trench, contact, and slot contact structures can be created with significant reduction in cost, time and roughness. Final patterning performance in terms of edge placement error, line-edge roughness, and local/global critical dimension uniformity are consistent to that of SAMP but with the less overall complexity and cost. These performance metrics associated with this fast etching grafting polymer and anti-spacer approach greatly improves processing capability as compared to a conventional EUV exposure process.

Processes herein can be applied to various patterning schemes include "anti-spacer" patterning flows. Conventionally, when spacers are formed on sidewalls of mandrels, the mandrels are removed and sidewall spacers are then used as a mask for transferring a pattern into an underlying layer, thereby forming lines in the underlying layer. In an anti-spacer flow, sidewall spacers are formed on a mandrel (typically via de-protection from acid diffusion either into, or out of, the filler material or mandrel material), a filler material is located on the non-mandrel side of the spacers, and then the spacers themselves are removed before transferring a pattern to an underlying layer. Thus, the space formerly occupied by the spacers now defines a pattern to transfer into an underlying layer, hence the term anti-spacer. This anti-spacer flow is useful at least for creating relatively narrow trenches in an underlying layer. Techniques herein include grafting and/or deposition of an etch-selective spacer material (anti-spacer flow) that selectively adheres to a mandrel, such as a pre-patterned mandrel. A substrate with spacer material selectively adhering to mandrels—without adhering to underlying layer material—is then either overcoated with a filler material or has a filler material deposited thereon having an etch selectivity (etch resistivity) different from that of the spacer material (anti-spacer material), but not necessarily different than etch selectivity of the mandrel material. Example spacer material can include spin-on polymer compositions that can have a high selectivity to photoresist, organic planarization layers, amorphous carbon, etc. Such spin-on polymer composition can include a functional group which will graft or adhere to a surface of mandrel material without forming a similar attachment to target layer material.

The substrate can then be etched to strip back any over-burden covering the spacer and mandrel pattern until at least the spacer material is uncovered. Because the spacer material has an etch rate significantly greater relative to the mandrel and filler material, once the spacer material is uncovered the spacer material is quickly removed resulting in a patterned layer with the pattern defined by the now removed spacer material. This pattern is typically a trench, and so a trench can be created in a target layer positioned underneath the pattern. Trenches produced in this process result in a critical dimension (CD) that is controlled by either the polymer length of the spacer material, and/or the deposition process used for the spacer material, for example, if deposited by chemical vapor deposition (CVD) or atomic layer deposition (ALD). The remaining mandrel and filler material only need to have etch resistivity with respect to one another in order to optionally transfer the trench pattern into a more suitable hard-mask material or underlying memorization layer for later recombination and/or pattern reversal. The anti-spacer process can be expanded on in order to create contact and slot contact patterns by incorporating a similar approach as outlined above, using elevationally crossed patterns, and/or using additional processing techniques described below.

For convenience in describing embodiments herein, the following description will primarily describe patterning of slot contact structures. Those skilled in the art will readily appreciate application to other structures as well as accompanying modifications for other patterning schemes. Referring now to FIG. 1, a schematic drawing illustrates a cross-sectional segment of an example substrate 100 for use with processes herein. Substrate 100 includes mandrels 110 positioned on a target layer 107, which in turn is positioned on one or more underlying layers 105. Substrate 100 can include a silicon wafer, such as those used in microfabrication, for manufacturing integrated circuits, digital displays, etc. Mandrels 110 can be patterned or fabricated using various techniques. Selection of mandrel material is such that mandrels comprise a first material and the target layer 107 comprises a second material, with the second material being chemically different than the first material. In other words, if target layer 107 is considered the "floor," then the mandrel structures on the floor have a different chemical composition such that certain materials react differently with the mandrels as compared to the target layer. Selection is such that mandrels provide a grafting or adhesion surface to which a specific spacer material can selectively attach. Mandrels thus will provide an inner side of a slot contact structure. Note that being chemically different herein does not require different atomic composition, but can comprise different bonding or crystal structures that provide different surface characteristics.

Mandrels can be comprised of a wide variety of materials. Mandrels can be comprised of oxide, nitride, metal, oxide-covered photoresist, hardened photoresist, and silicon. The mandrel material can be a material having a hardness value greater than a hardness value of a polymer-based photoresist material. If photoresist is selected for use as a mandrel material, then some additional processing can be included to improve effectiveness, such as by rendering photoresist material insensitive to any subsequent lithographic exposure. Subsequent lithographic exposure can be executed in embodiments with crossed patterns. There are various techniques to treat photoresist material to harden, desensitize, or otherwise prep for subsequent processing. For example, applying negative current direct current power to an upper silicon-containing electrode can generate a ballistic electron beam for photoresist hardening and also deposit an oxide film for additional protection. Such e-beam curing can cross-link the photoresist to prevent additional acid generation. Other treatments can include vacuum ultraviolet (VUV) exposure for cross-linking. Another option is chemical overcoat or infiltration to render the photoresist insusceptible to de-protection.

If mandrel material is similar or identical to target layer material, then a surface treatment of the mandrels can be performed to create an adhesion surface different than a target layer surface. For example, the mandrel can have a thin oxide deposition sputtered onto the surface. Alternatively an atomic layer deposition (ALD) can be performed to change surface properties. Other plasma-based treatments can be used to change surface energies of exposed mandrel material to enable subsequent selective adhesion.

Figure 2:
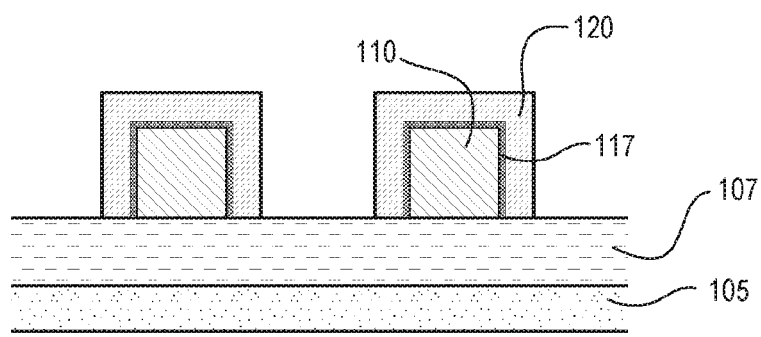

After providing, creating, or otherwise receiving the substrate, a spacer material is deposited on the substrate with a result that the spacer material selectively adheres to exposed surfaces of the mandrels without adhering to exposed (not covered) surfaces of the target layer. This selective deposition results in a substantially uniform thickness of spacers formed on mandrel surfaces, including sidewalls of the mandrels. FIG. 2 is an example result showing spacer material adhered to mandrels 110. Surface 117 designates an adhesion surface, which could also be labeled as a grafting surface. At surface 117, the spacer material adheres to the mandrel. Note that surface 117 does not appear at the interface of spacers and target layer 107. Spacers can be in contact with a portion of target layer 107 at interface locations, but without having a chemical attachment with the target layer 107 in contrast to the attachment to mandrels 110 at surface 117.

There are several options for depositing spacer material on the substrate. One option includes depositing the spacer material as a liquid on the substrate. This can be a spin-coating deposition. For example, a given substrate can be spinning in a coating chamber while spacer material is deposited on the substrate. The spinning action spreads spacer material across the substrate surface to cover the substrate. Spacer material that comes in contact with mandrels adheres to mandrel surfaces. Only polymers adhering to the mandrel surfaces will remain, while remaining spacer material can be removed using wet removal, such as solvent stripping and wet development. Such spin-on polymer deposition can be known as directed chemical overcoat, which is applying a composition that is directed to selectively attach to one material without attaching to the other. Alternative techniques for depositing the spacer material include chemical vapor deposition (CVD) and atomic layer deposition (ALD). ALD or CVD deposited material is selected to have etch selectivity to the mandrel and subsequent filler material. ALD and CVD materials are less-capable of selective grafting, and so using these materials can involve a conformal deposition followed by a spacer-open etch.

In some embodiments, deposition of the spacer material can include selecting a polymer size and radius of gyration resulting in a predetermined thickness of spacer material adhered to the mandrels. Such spacer material can be selected to have a polymer length between 1.0 nanometers and 20 nanometers. In other words, polymer length of a given spacer material can directly determine a thickness of spacers that selectively adhere to mandrels. Polymer lengths greater than 20 nanometers can also be used, although such lengths can result in polymers folding over each other, thereby creating a non-uniform or variable thickness.

The spacer material can have a composition that has an etch resistance value less than an etch resistance value of mandrel and filler material. In other words, when an etch procedure is executed, the spacers or spacer material will be etched (removed) at a rate at least twice that of mandrel and filler material removal. In some embodiments, the spacer material is selected to have an Ohnishi parameter value greater than an Ohnishi parameter of both the mandrels and the filler material. The Ohnishi parameter is a measure of a given material's etch resistance. Wet or dry etching resistance can be estimated by the Ohnishi parameter of a resist composition. The Ohnishi parameter can be defined as: $(N/(Nc-No))$, where $N$ expresses the total number of atoms, $Nc$ expresses the number of carbon atoms, and $No$ expresses the number of oxygen atoms. Thus, a photoresist with high carbon content acts as a better etch mask than does a photoresist with high oxygen content under oxygen plasma reactive ion etching (RIE). Excellent dry etching ability is obtained when the Ohnishi parameter is small. For example, a resist composition having an Ohnishi parameter that is equal to or less than 4.0 has good etch resistance, while values less than 2.5 indicate high etch resistance. For example, a high carbon content polymer, such as poly (hydroxy-styrene), has an Ohnishi parameter (etch rate) of about 2.5, while an oxygen-containing polymer such as poly(methylmethacrylate) has an Ohnishi parameter of about 5.0. Any ring structures present can also contribute to a high etch resistance. Thus, materials with an Ohnishi parameter of about 3.0 and greater have little or no etch resistance.

Figure 3:
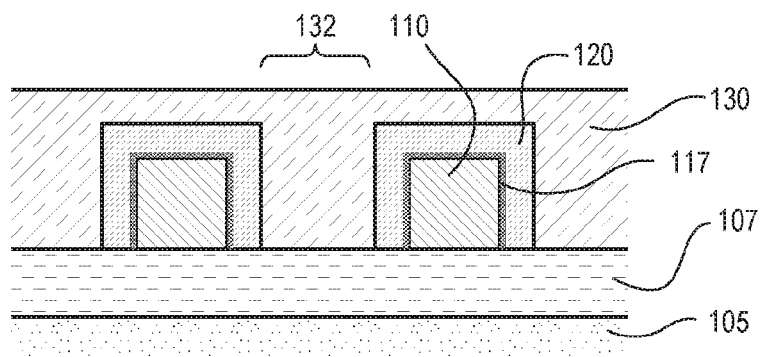

In a next step, a filler material is deposited on the substrate with the result that filler material fills spaces defined by spacer material on sidewall of the mandrels. In other words, spaces between sidewall spacers and any other openings are filled with filler material. The filler material contacts (or can be in contact with) the target layer through the defined spaces, that is, within openings having access to the target layer. The filler material forms a vertical interface with the spacers on sidewalls of the spacers (opposite to spacer sidewalls adhered to mandrels. The filler material comprises a third material. FIG. 3 shows an example result of filler material 130 deposition. Note that filler material at least fills spaces 132 between spacers. In most embodiments, filler material can cover the spacers and the mandrels, especially when deposited using a spin-coat deposition. In some embodiments, an organic spin-on hardmask material such as a polystyrene-type polymer can be deposited as the filler material (overburden film).

Other embodiments can include a silicon-containing anti-reflective coating or amorphous carbon material. The filler material can define outer edges of a slot contact structure after spacer material is removed, leaving only the mandrels and the filler material. The filler material has an etch selectivity to the spacer material and to the target layer between mandrel structures. Depositing the filler material can result in a planar surface on the substrate, as depicted in FIG. 3. Controlling deposition to result in this flat surface is beneficial for subsequent processing such as applying a photoresist film on the planar surface. In some embodiments, filler material selection can be based on minimizing reflection of light from a secondary exposure step back into the overlying photoresist, and/or that can provide anti-reflectivity properties for an overlying photoresist.

Figure 4:
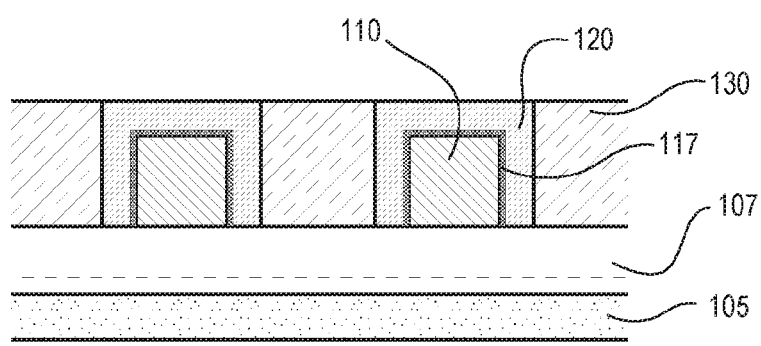

In a next step, spacers are removed from the substrate resulting in the filler material and mandrels together defining a combined pattern (relief pattern). Removing the spacers can include executing an etch process using an etch chemistry that etches the spacer material at an etch rate more than two times an etch rate of the mandrel material and the filler material. Note that etch rates can be higher than this amount depending on material selections. In typical flows, there is some overburden filler material to remove prior to removal of the spacers. Thus, removing spacers can include executing a planarization process that removes material from the substrate at least above an upper surface of the spacers. This removal can remove material down to an upper surface of the mandrels, for example, if the mandrels function as a chemical mechanical polishing (CMP) stop material. For non-abrasive planarization treatment, a blanket etch procedure can etch away the filler material down to the spacers or below a top surface of the spacers. Alternatively, the planarization process includes executing an acid diffusion process that solubilizes filler material from a top surface of the filler material down to at least a top surface of the spacer material. In other words, and slim-back process can be executed to pull down the filler material to at least become flush with the spacers or even recessed below the spacers. In an alternative example, a 365 nm photoresist can be used as the filler material (resulting in an overburden) which is then flood exposed at 365 nm wavelength to selectively develop away the overburden portion of the filler material. An example result of this planarization step is shown in FIG. 4.

Figure 5:
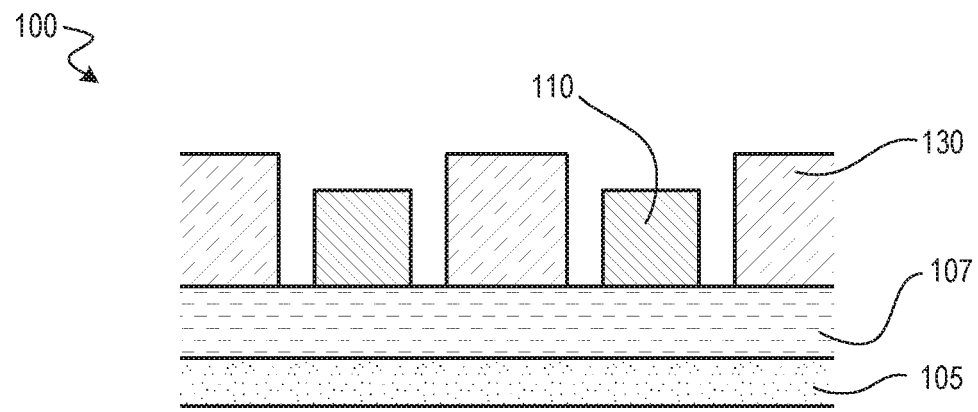

With spacers uncovered on the substrate, the spacers can then be selectively removed, such as by using an plasma-based etch procedure using chemistry selective to the spacers to remove the spacer material at a greater rate than any etching of the mandrels and remaining filler material. This results in a combined pattern. FIG. 5 shows a depiction of this combined pattern with the spacers removed. Note that in this combined pattern, the spaces defined by the mandrels and filler material have a relatively narrow CD, which can be controlled by the polymer length of the spacer material. Thus, trenches for pattern transfer can be created from approximately 1-20 nanometers in length, which are dimensions smaller than resolution of conventional photolithographic scanner systems.

Figure 6:
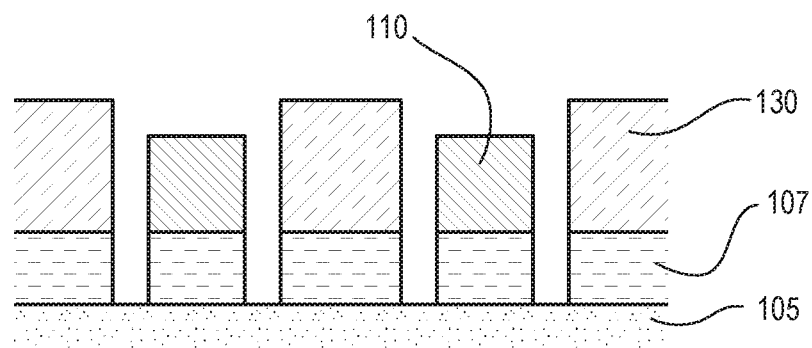
Figure 7:
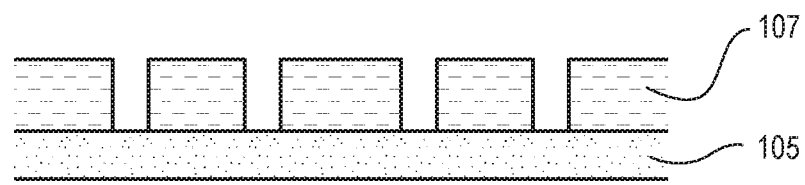

After creating this combined pattern, the combined pattern can then be transferred into the target layer 107 as shown in FIG. 6. The mandrels 110 and filler material 130 can then be removed. An example result is shown in FIG. 7. FIG. 7 can represent a set of finally patterned structures, a hardmask for subsequent etching, a memorized pattern to be combined with a subsequent pattern, and so forth.

Figure 8:
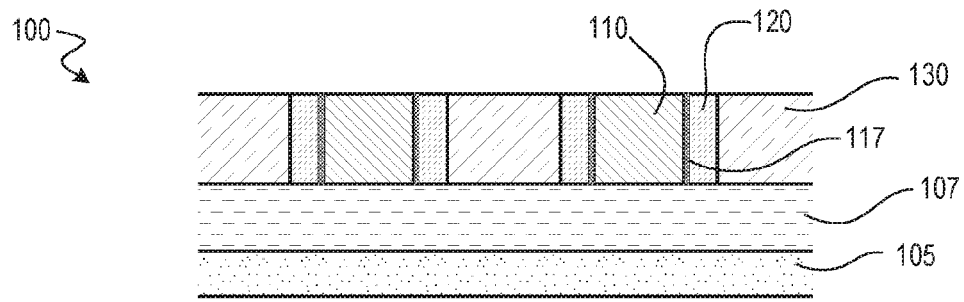
FIGS. 8-11 are schematic, cross-sectional views of a substrate segment showing a process sequence for patterning a substrate according to embodiments herein.
Figure 9:
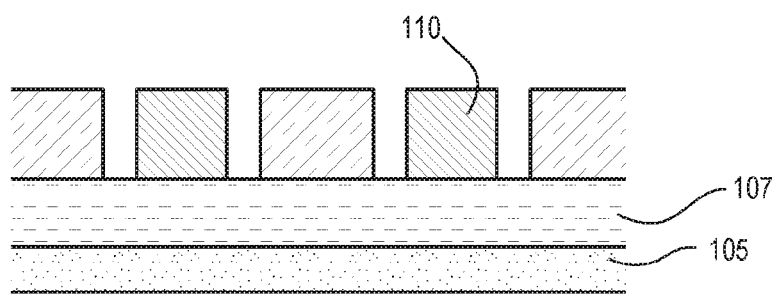

Accordingly, after removing spacers, the combined pattern can be used for pattern transfer. In other embodiments, however, the combined patterned can be used for compound patterning. FIGS. 8 and 9 illustrate removing spacers 120 to create a combined pattern as previously described. At this point, techniques can include depositing a planarization layer on the combined pattern, depositing a photoresist film on the planarization layer, and executing a photolithographic patterning process that forms an elevationally crossed pattern with the combined pattern. Typically, lines or features in the second or upper pattern generally run perpendicular to trenches or lines in the first pattern (combined pattern). By crossing each other elevationally, each pattern can be on a different level/layer of the substrate but from a perpendicular view or directional etch perspective of the working surface of the substrate, the patterns have features that appear to cross each other and are combined during a subsequent directional etch. Thus, even if two patterns to not physically intersect, there is an intersection seen from a perspective perpendicular to the working surface of the substrate. For example, a rectangular opening crossing a linear opening means that an underling layer or target layer can only be seen as a line segment to be etched. In another example, if two trenches elevationally crossed each other, then a square-shaped intersection would be created.

Figure 10:
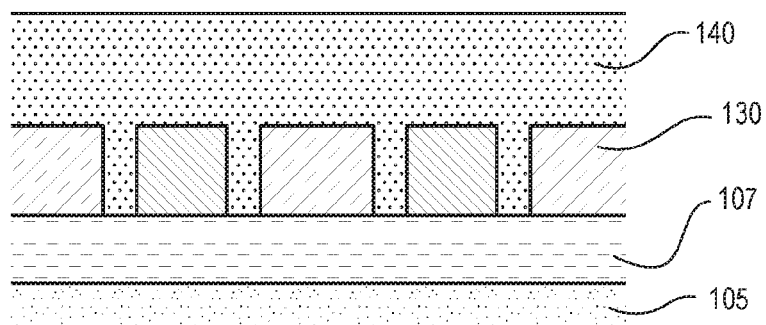

Thus, a subsequent step can include covering the combined pattern with a layer of radiation-sensitive material (such as photoresist), and then developing an exposure pattern in the layer of radiation-sensitive material. FIG. 10 shows a result of radiation-sensitive material 140 covering the substrate. The exposure pattern can be created via photolithography, wherein developing the exposure pattern results in a second mask that uncovers (reveals) portions of the combined pattern. The second mask and the combined pattern then together define an elevationally-crossed pattern. An example result is shown in FIG. 11.

Thus, for example, a secondary photoresist can be coated overtop the remaining filler material and imaged to form a trench running perpendicular to the spaces formerly occupied by spacers. This added exposure (radiation) step highlights a benefit of treating any photoresist mandrel by an electron beam cure, ion implantation, VUV exposure, plasma treatment, chemical infiltration process, etc., in order to make the mandrel insensitive/impervious to this subsequent exposure step. When, for example, a perpendicular trench is opened by developing soluble material, this developing can uncover a portion of filler material and mandrel material.

An etch step can be used to selectively clear the spacers (spacer material) with minimal etching of remaining filler material and with minimal etching of the mandrels. If the spacer material is organic in nature (along with the filler and mandrel materials) such as a directed chemical overcoat version of directed self-assembly (DSA), then the Onishi parameter of the spacer material can be defined to have fast-etch characteristics relative to conventional organic films such as photoresist or organic planarization layer (OPL) spin-on hard-mask films. The area of the pattern to etch through to the target layer can be the intersection area of the anti-spacer "racetrack" and the trench defined by the second photoresist coating. This intersection area can then define a pair of slot contact shaped structures with critical dimensions highly controllable. For example, a major axis can be defined by trench width of the second lithography step. For conventional 193 nm lithography, example trenches can be 40 nm in size for single exposure process, but can be further reduced down to 20 nm through dry-etch trimming and/or subsequent chemical treatment. The major axis can be further tuned much lower by incorporating a SAMP process in addition to the second exposure. The minor axis can be defined by the polymer size and radius of gyration of the spacer material itself, which can range as small as approximately 1.0 nm for spin-on type of applications, and down below 1.0 nm for atomic layer deposition processing.

Figure 11:
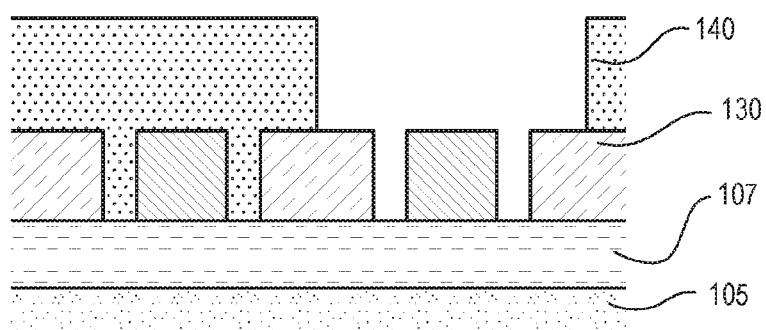
Figure 12:
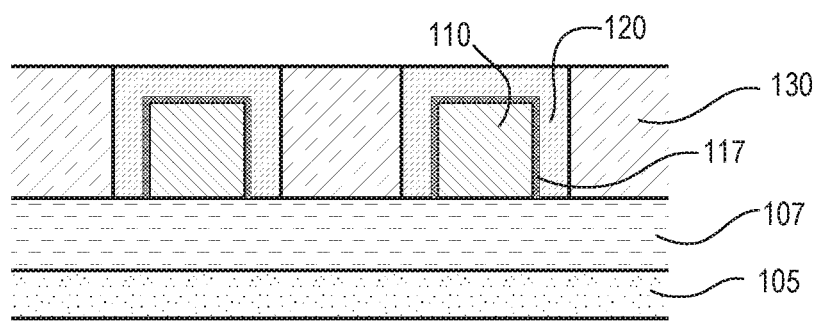
FIGS. 12-17 are schematic, cross-sectional views of a substrate segment showing a process sequence for patterning a substrate according to embodiments herein.

The elevationally combined pattern, as shown in FIG. 11, such as for a slot contact, can then be transferred to the underlying target layer (which could be a hard-mask) and then the remaining mandrel, filler material and second photoresist can be selectively stripped away, revealing precisely defined slot contact structures in the memorized hardmask film.

Figure 13:
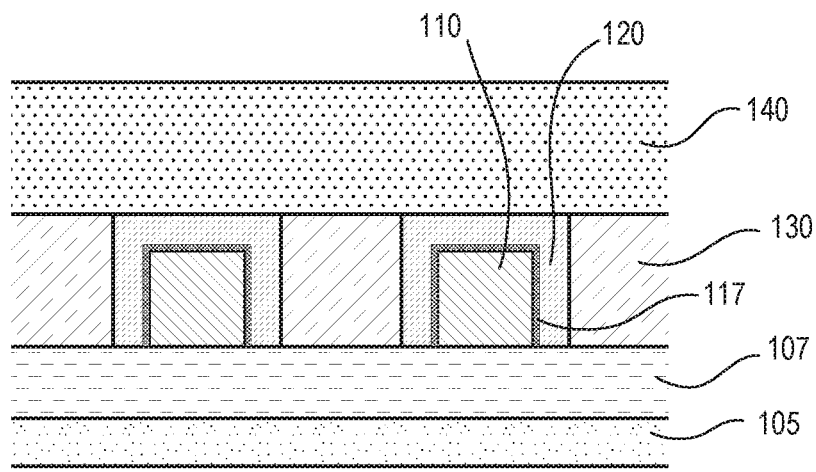
Figure 14:
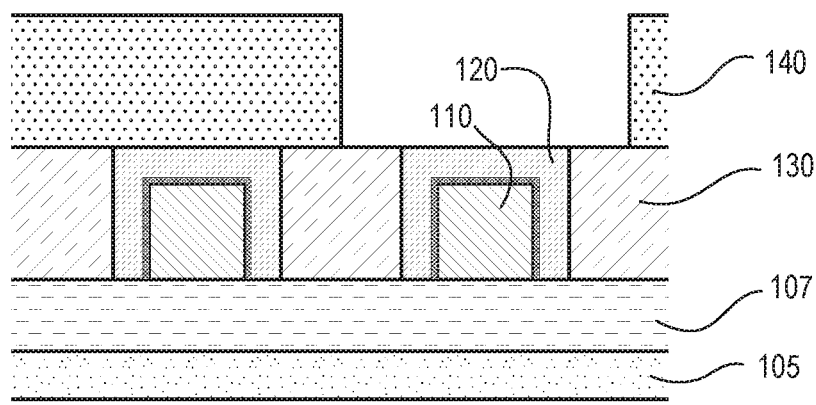
Figure 15:
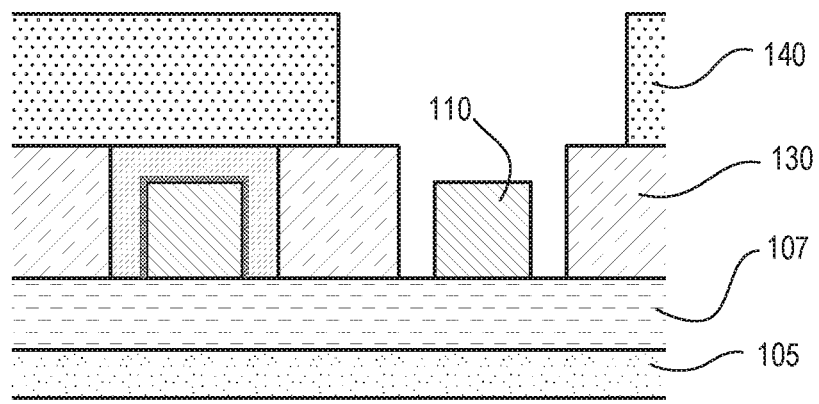
Figure 16:
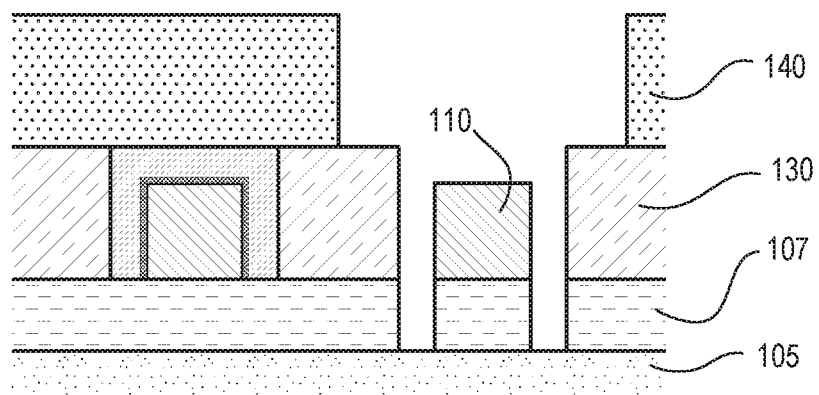
Figure 17:
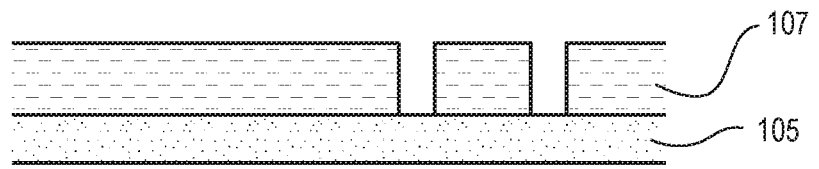

FIGS. 12-17 illustrate a similar flow as that shown in FIGS. 8-11. The difference between the two flows is that in FIGS. 8-11, spacers are removed prior to depositing a photoresist or other planarizing layer for subsequent patterning. Thus, in the embodiment of FIGS. 8-11, the planarizing material essentially fills in spaces previously occupied by spacer material. In contrast, FIGS. 12-17 depict a process flow in which the radiation-sensitive layer is applied prior to removing spacer material (FIG. 13). In this flow an exposed pattern is developed thereby uncovering a portion of the underlying substrate including uncovering segments of spacers 120, as shown in FIG. 14. At this point, uncovered spacers can be etched (while covered spacers remain on the substrate), thereby creating an elevationally combined pattern, which can define slots, contacts, and other mask structures, as shown in FIG. 15. This combined pattern can then be transferred into target layer 107 (FIG. 16), and then masking layers can be removed (FIG. 17).

As such, techniques herein can provide significant advantages. For example, such techniques improve overall processing complexity and cost compared to conventionally forming sub-resolution slot contacts, contact, and trench structures through SAMP processing and through sequential individual litho-etch-deposition processes. Other benefits include reduced edge placement error, improved line edge roughness, improved critical dimension control compared to EUV lithography capability, and sequential individual litho-etch-deposition processes. Incorporation of a fast-etching polymer film that can selectively adhere or attach to mandrel material but without adhering to the target layer on which the mandrel sits, enabling removal of a spacer-open etch step for the spacer material. Additionally, a given anti-spacer pattern can be defined until an end of unit processing, thus allowing any type of filler film to be used. Techniques herein can define critical dimension, size of a trench, contact, or slot contact feature by a physical polymer size which can be controlled down to approximately 1.0 nm. This translates to an overall critical dimension uniformity of a final pattern. Additionally the polymer size confers no influence from the size and pitch of the mandrels on which it is formed so there are also negated mask-error factors, through-pitch, and linearity effects of final trench or contact pattern.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a pattern on a substrate, the method comprising:
   providing a substrate having mandrels positioned on a target layer, the mandrels comprising a first material and the target layer comprising a second material, the second material being chemically different than the first material;
   depositing a spacer material on the substrate, the spacer material selectively adhering to exposed surfaces of the mandrels without adhering to exposed surfaces of the target layer, resulting in spacers being formed in which the spacers have a substantially uniform thickness at least on sidewalls of the mandrels;
   depositing a filler material on the substrate that fills spaces defined by the spacer material on sidewalls of the mandrels, the filler material contacting the target layer through the defined spaces, the filler material forming a vertical interface with the spacers on sidewalls of the spacers, the filler material comprising a third material; and
   removing the spacers resulting in the filler material and the mandrels remaining on the substrate and together defining a combined pattern.

2. The method of claim 1, wherein depositing the spacer material includes depositing the spacer material as a liquid on the substrate.

3. The method of claim 2, wherein depositing the spacer material includes spinning the substrate causing the spacer material to cover the substrate.

4. The method of claim 1, wherein depositing the spacer material includes depositing the spacer material via atomic layer deposition (ALD) or chemical vapor deposition (CVD).

5. The method of claim 1, wherein depositing the spacer material includes selecting a polymer size and radius of gyration resulting in a predetermined thickness of spacer material adhered to the mandrels.

6. The method of claim 5, wherein depositing the spacer material includes selecting a spacer material having a polymer length between 1.0 nanometers and 20 nanometers.

7. The method of claim 1, wherein the spacer material is selected to have an etch resistance value less than an etch resistance value of first material and the filler material.

8. The method of claim 1, wherein the spacer material is selected to have an Ohnishi parameter value greater than an Ohnishi parameter of both the mandrels and the filler material.

9. The method of claim 1, wherein the filler material is silicon-containing anti-reflective coating or amorphous carbon.

10. The method of claim 1, wherein removing the spacers includes executing an etch process using an etch chemistry that etches the spacer material at an etch rate more than two times an etch rate of the first material and the filler material.

11. A method of forming a pattern on a substrate, the method comprising:
provinding a substrate having mandrels positioned on a target layer, the mandrels comprising a first material and the target layer comprising a second material, the second material being chemically different than the first material;
depositing a spacer material on the substrate, the spacer material selectively adhering to exposed surfaces of the mandrels without adhering to exposed surfaces of the target layer, resulting in spacers being formed in which the spacers have a substantially uniform thickness at least on sidewalls of the mandrels;
depositing a filler material on the substrate that fills spaces defined by the spacer material on sidewalls of the mandrels, the filler material contacting the target layer through the defined spaces, the filler material forming a vertical interface with the spacers on sidewalls of the spacers, the filler material comprising a third material; and
removing the spacers resulting in the filler material and the mandrels remaining on the substrate and together defining a combined pattern wherein removing the spacers includes executing a planarization process that removes material from the substrate at least above an upper surface of the spacers wherein executing the planarization process includes executing an acid diffusion process that solubilizes the filler material from a top surface of the filler material to at least a top surface of the spacer material.

12. The method of claim 1, further comprising, transferring the combined pattern into the target layer.

13. The method of claim 1, further comprising, depositing a planarization layer on the combined pattern, depositing a photoresist film on the planarization layer, and executing a photolithographic patterning process that forms an elevationally crossed pattern with the combined pattern.

14. A method of forming a pattern on a substrate, the method comprising:
providing a substrate having mandrels positioned on a target layer, the mandrels comprising a first material and the target layer comprising a second material, the second material being chemically different than the first material;
depositing a spacer material in the substrate, the spacer material selectively adhering to exposed surfaces of the mandrels without adhering to exposed surfaces of the target layer, resulting in spacers being formed in which the spacers have a substantially uniform thickness at least on sidewalls of the mandrels;
depositing a filler material on the substrate that fills spaces defined by the spacer material on sidewalls of the mandrels, the filler material contacting the target layer through the defined spaces, the filler material forming a vertical interface with the spacers on sidewalls of the spacers, the filler material comprising a third material;
removing the spacers resulting in the filler material and the mandrels remaining on the substrate and together defining a combined pattern;
covering the combined pattern with a layer of radiation-sensitive material; and
developing an exposure pattern in the layer of radiation-sensitive material, the exposure pattern having been created via photolithography, wherein developing the exposure pattern results in a second mask that exposes portions of the combined pattern, the second mask and the combined pattern together defining an elevationally crossed pattern.

15. The method of claim 1, further comprising, prior to depositing the spacer material, modifying exposed surfaces of the mandrels with a treatment that results in the spacer material adhering to exposed surfaces of the mandrels when in contact with the exposed surfaces of the mandrels.

16. The method of claim 1, wherein the first material has a hardness value greater than a hardness value of a polymer-based photoresist material.

17. The method of claim 1, wherein the first material is selected from the group consisting of, oxide, nitride, metal, oxide-covered photoresist, hardened photoresist, and silicon.

18. A method of forming a pattern on a substrate, the method comprising:
providing a substrate having mandrels positioned on a target layer, the mandrels comprising a first material and the target layer comprising a second material, the second material being chemically different than the first material, wherein the first material is a patterned photoresist material, wherein providing the substrate having the mandrels includes lithographically exposing and developing a layer of photoresist followed by a ballistic electron treatment and silicon sputter depositon resulting in an oxide layer forming on exposed surfaces of the photoresist;
depositing a spacer material on the substrate, the spacer material selectively adhering to exposed surfaces of the mandrels without adhering to exposed surfaces of the target layer, resulting in spacers being formed in which the spacers have a substantially uniform thickness at least on sidewalls of the mandrels;
depositing a filler material on the substrate that fills spaces defined by the spacer material on sidewalls of the mandrels, the filler material contacting the target layer through the defined spaces, the filler material forming a vertical interface with the spacers on sidewalls of the spacers, the filler material comprising a third material; and
removing the spacers resulting in the filler material and the mandrels remaining on the substrate and together defining a combined pattern.

* * * * *